United States Patent [19]

Hirakawa et al.

[11] Patent Number: 5,698,899
[45] Date of Patent: Dec. 16, 1997

[54] SEMICONDUCTOR DEVICE WITH FIRST AND SECOND SEALING RESINS

[75] Inventors: Satoshi Hirakawa; Haruo Takao, both of Fukuoka, Japan

[73] Assignee: Mitsubishi Denki Kabushiki Kaisha, Tokyo, Japan

[21] Appl. No.: 666,946

[22] Filed: Jun. 20, 1996

[30] Foreign Application Priority Data

Nov. 30, 1995 [JP] Japan ........................... 7-312557

[51] Int. Cl.$^6$ ............... H01L 23/02; H01L 23/30
[52] U.S. Cl. ............... 257/712; 257/675; 257/790; 257/796; 257/706; 257/709; 257/717; 257/720
[58] Field of Search .............. 257/664, 675, 257/790, 788, 796, 706, 709, 712, 717, 720, 707, 789, 787

[56] References Cited

U.S. PATENT DOCUMENTS

| 3,930,114 | 12/1975 | Hodge ........................... 257/712 |
| 5,430,331 | 7/1995 | Hamzehdoost et al. ........... 257/796 |
| 5,442,234 | 8/1995 | Liang ........................... 257/675 |
| 5,530,295 | 6/1996 | Mehr ........................... 257/796 |

FOREIGN PATENT DOCUMENTS

| 63-7637 | 1/1988 | Japan . | |
| 0141353 | 6/1988 | Japan ........................... 257/790 |
| 2 181463 | 7/1990 | Japan . | |
| 0066150 | 3/1991 | Japan ........................... 257/790 |
| 0038857 | 2/1992 | Japan ........................... 257/788 |
| 4 92459 | 3/1992 | Japan . | |
| 0139749 | 5/1992 | Japan ........................... 257/790 |
| 0082674 | 4/1993 | Japan ........................... 257/788 |
| 0211262 | 8/1993 | Japan ........................... 257/675 |
| 7 250485 | 9/1995 | Japan . | |
| 0004552 | 5/1989 | WIPO ........................... 257/787 |

*Primary Examiner*—Tom Thomas
*Assistant Examiner*—Alexander Oscar Williams
*Attorney, Agent, or Firm*—Oblon, Spivak, McClelland, Maier & Neustadt, P.C.

[57] ABSTRACT

It is an object to increase a breakdown voltage of a lead frame. A primary sealing resin (41) seals the upper main surface of a lead frame (3) and elements mounted thereon. A secondary sealing resin (21) coupling the lead frame (3) and a heat sink (51) passes through gaps of the lead frame (3) having pattern configuration to project on the upper main surface side of the lead frame (3). The primary sealing resin (41) is in close contact with the projections (62). The projections (62) enlarge the creeping distance along the interface between the primary sealing resin (41) and the secondary sealing resin (21) between parts of the lead frame (3) adjacent with gaps therebetween, so that the breakdown voltage between those parts is increased.

19 Claims, 12 Drawing Sheets

1

SEMICONDUCTOR DEVICE WITH FIRST AND SECOND SEALING RESINS

BACKGROUND OF THE INVENTION

1. Field of the Invention

The present invention relates to a semiconductor device having a structure in which a heat radiating heat sink, a lead frame and a power semiconductor element provided thereon are sealed with a resin.

2. Description of the Background Art

FIG. 23 is a sectional view showing the inside structure of a conventional semiconductor device as the background of the present invention. In this device 150, the lead frame 121 and the heat sink 127 are sealed with the sealing resin 120. One main surface of the lead frame 121 is provided with elements (not shown) and the heat sink 127 faces its other main surface at an interval.

The sealing resin 120 has a double-mold structure which is formed of a primary sealing resin 122 and a secondary sealing resin 126 composed of an expensive material with better heat conductivity. The primary sealing resin 122 includes the body 123 sealing the elements on the lead frame 121 and the spacer portions 124 protruding from the other main surface of the lead frame 121. The secondary sealing resin 126 fills the narrow gap between the lead frame 121 and the heat sink 127 to electrically insulate them and to well conduct the loss of heat of the elements from the lead frame 121 to the heat sink 127.

The secondary sealing resin 126 also covers the entirety of the primary sealing resin 122 including the body 123. This improves the close contact between the secondary sealing resin 126 and the primary sealing resin 122. In order to further improve the close contact between the secondary sealing resin 126 and the primary sealing resin 122, the unevenness 125 is formed in the interface between the body 123 of the primary sealing resin 122 and the secondary sealing resin 126.

The spacer portions 124 exist between the lead frame 121 and the heat sink 127. In the process of sealing with the sealing resin 120, the lead frame 121 is first sealed up and then sealing up with the secondary sealing resin 126 is carried out. In this process of sealing with the secondary sealing resin 126, the spacer portions 124 interposed between the lead frame 121 and the heat sink 127 allow the interval and the parallelism between the lead frame 121 and the heat sink 127 to be determined precisely.

The heat sink 127 is provided with retracted surfaces 128 and the lead frame 121 is bent like steps to enlarge the creeping distance between the lead frame 121 and the heat sink 127 along the interface between the spacer portion 124 and the secondary sealing resin 126 to ensure a breakdown voltage between the lead frame 121 and the heat sink 127 as the rated value. The spacer portion 124 is disposed between the retracted surface 128 and the part of the lead frame 121 separated away from the heat sink 127.

The conventional device 150 constituted as described above has problems as follows. First, as shown in the partial enlarged view of FIG. 24, the interface between the primary sealing resin 122 and the secondary sealing resin 126 exists in the blanks of the lead frame 121. Thus, the creeping distance Q along this interface between parts of the lead frame 121 adjacent with the blank therebetween is the shortest straight distance. As a result, it has a problem that the breakdown voltage in the lead frame 121 is deteriorated with peeling at the interface.

2

Second, as it is not enough to provide the retracted surfaces 128 in the heat sink 127 to ensure the breakdown voltage between the lead frame 121 and the heat sink 127 along the interface between the spacer portion 124 and the secondary sealing resin 126, the lead frame 121 must be subjected to bending process into a complicated shape. This produces the problem that the manufacturing cost is high.

Third, the interval between the lead frame 121 and the heat sink 127 is set narrow as 1 mm or smaller to secure good thermal conductivity. This causes formation of voids in the secondary sealing resin 126 filling the gap in the process of sealing with the secondary sealing resin 126 because the fluidity of the secondary sealing resin 126 flowing in the gap is bad. This results in the problem that a breakdown voltage may not be obtained as designed between the lead frame 121 and the heat sink 127.

Fourth, the secondary sealing resin 126 mainly put under the lead frame 121 is composed of an expensive material, which causes the problem that the manufacturing cost is high. That is to say, the conventional device 150 has a problem that a large amount of expensive secondary sealing resin 126 is used.

SUMMARY OF THE INVENTION

A first aspect of the present invention is directed to a semiconductor device which includes: a lead frame shaped like a sheet with electrical conductivity having first and second main surfaces, having pattern configuration, and having external terminals protruding outward provided therearound; a power semiconductor element fixed on said first main surface; a heat sink with thermal conductivity provided to face the second main surface with a gap therebetween; and a sealing resin being electrically insulating and sealing the power semiconductor element, the lead frame and the heat sink.

According to the present invention, in the semiconductor device, the sealing resin has a primary sealing resin and a secondary sealing resin with more excellent thermal conductivity than that of the primary sealing resin, the secondary sealing resin has a gap filling portion filling the gap in close contact with the second main surface and a projecting portion integrally coupled with the gap filling portion and passing through a blank defined within the pattern configuration of the lead frame to protrude like a wall on the first main surface side, and the primary sealing resin is in close contact with the first main surface and buries the power semiconductor element, and is in close contact with the projecting portion.

Preferably, according to a second aspect, the gap through which the projecting portion passes includes a blank portion separating parts of the lead frame requiting a highest breakdown voltage thereacross in the lead frame.

Preferably, according to a third aspect, a thickness of the projecting portion at a portion passing through the blank coincides with a width of the blank.

A fourth aspect of the present invention is directed to a semiconductor device which includes: a lead frame shaped like a sheet with electrical conductivity having first and second main surfaces, having pattern configuration, and having external terminals protruding outward provided therearound; a power semiconductor element fixed on the first main surface; a heat sink with thermal conductivity provided to face the second main surface with a gap therebetween; and a sealing resin being electrically insulating and sealing the power semiconductor element, the lead frame, and the heat sink; wherein the sealing resin has a primary sealing resin and a secondary sealing resin with heat conductivity more excellent than that of the primary sealing resin; the primary sealing resin has a body portion in close contact with the first main surface and burying the power semiconductor element and a plurality of spacer portions being like projection selectively in close contact with the second main surface and having its end portion abutting on the heat sink; the secondary sealing resin has a portion which is selectively in close contact with a region including a portion corresponding to the power semiconductor element in the second main surface and fills a portion of the gap defined between the region and the heat sink; and the plurality of spacer portions are disposed off a region required to have a highest breakdown voltage with respect to the heat sink in the lead frame.

Preferably, according to a fifth aspect, the plurality of spacer portions are arranged being divided at four or more portions.

Preferably, according to a sixth aspect, the heat sink has a flat surface facing in parallel to the region including the portion corresponding to the power semiconductor element in the second main surface and a retracted surface retracted from the flat surface and abutting on the plurality of spacer portions.

A seventh aspect of the present invention is directed to a semiconductor device which includes: a lead frame shaped like a sheet with electrical conductivity having first and second main surfaces, having pattern configuration, and having external terminals protruding outward provided therearound; a power semiconductor element fixed on the first main surface; a heat sink with thermal conductivity provided to face the second main surface with a gap therebetween; and a sealing resin being electrically insulating and sealing the power semiconductor element, the lead frame, and the heat sink; wherein the sealing resin has a primary sealing resin and a secondary sealing resin with heat conductivity more excellent than that of the primary sealing resin; the primary sealing resin has a body portion in close contact with the first main surface and burying the power semiconductor element; the secondary sealing resin has a portion filling the gap in close contact with the second main surface and a portion covering the body portion; and the body portion has a projection linearly crossing from one end to the other on its surface, a top end of the projection reaching a surface of the secondary sealing resin covering the body portion.

Preferably, according to an eighth aspect, a transverse section of the projection is shaped so that one point of the top end projects from any point in the transverse section.

A ninth aspect of the present invention is directed to a semiconductor device which includes: a lead frame shaped like a sheet with electrical conductivity having first and second main surfaces, having pattern configuration, and having external terminals protruding outward provided therearound; a power semiconductor element fixed on the first main surface; a heat sink with thermal conductivity provided to face the second main surface with a gap therebetween; and a sealing resin being electrically insulating and sealing the power semiconductor element, the lead frame, and the heat sink; wherein the sealing resin has a primary sealing resin and a secondary sealing resin with heat conductivity more excellent than that of the primary sealing resin; the heat sink is disposed to selectively face a region including a portion corresponding to the power semiconductor element in the second main surface; the primary sealing resin has a body portion in close contact with the first main surface and burying the power semiconductor element and a block portion being like a projection selectively in close contact with the second main surface; the secondary sealing resin has a portion selectively in close contact with the region including the portion corresponding to the power semiconductor element in the second main surface and filling a portion of the gap defined between the region and the heat sink; the heat sink and the block portion are arranged almost in parallel in a region facing the second main surface; and the block portion occupies a main part of the sealing resin positioned on the second main surface side.

Preferably, according to a tenth aspect, an end of the block portion is exposed to the outside.

Preferably, according to an eleventh aspect, the block portion extends across the sealing resin located on the second main surface side from its one end to the other end along the second main surface, and the secondary sealing resin further has a portion covering the body portion.

Preferably, according to a twelfth aspect, a part of an end of the block portion abuts on the heat sink, the part is disposed off a region facing a region required to have a highest breakdown voltage with respect to the heat sink in the lead frame, and the secondary sealing resin further has a portion covering the block portion.

Preferably, according to a thirteenth aspect, the heat sink has a flat surface facing in parallel to the region including the portion corresponding to the power semiconductor element in the second main surface and a retracted surface retracted from the flat surface and abutting on the block portion.

Preferably, according to a fourteenth aspect, the primary sealing resin further has a spacer portion being like a projection selectively in close contact with the second main surface and having its end abutting on the heat sink, and the spacer portion is disposed off the region required to have a highest breakdown voltage with respect to the heat sink in the lead frame.

Preferably, according to a fifteenth aspect, the semiconductor device further comprises a controlling semiconductor element fixed on the first main surface for controlling the power semiconductor element, the body portion also burying the controlling semiconductor element.

According to the device of the first aspect, the secondary sealing resin filling the gap between the lead frame and the heat sink in close contact with the second main surface passes through the blank of the lead frame to project like a wall on the first main surface side, and the primary sealing resin which buries the power semiconductor element in close contact with the first main surface is further in close contact with the projection. This enlarges the creeping distance along the interface between the primary sealing resin and the secondary sealing resin between parts of the lead frame adjacent with the blank therebetween.

This improves the breakdown voltage between these parts of the lead frame, i.e., improves the insulation therebetween. Also, the improved breakdown voltage allows the width of the blank of the lead frame to be narrowed so that the lead frame is miniaturized, which allows the device to be miniaturized. Furthermore, since the primary sealing resin is in close contact with the projection of the secondary sealing resin, peeling is suppressed at the interface between the primary sealing resin and the secondary sealing resin.

According to the device of the second aspect, the projection of the secondary sealing resin passes through the blank separating the parts of the lead frame which requires the highest breakdown voltage. That is to say, the projection is appropriately disposed in a portion where it is required most.

Accordingly, the reliability of the device with respect to the breakdown voltage is much higher.

According to the device of the third aspect, the thickness of the projection at the portion passing through the blank coincides with the width of the blank. That is to say, the blank is utilized most efficiently to enhance the breakdown voltage, which provides the highest breakdown voltage between the adjacent parts of the lead frame with the blank therebetween.

According to the device of the fourth aspect, since the primary sealing resin has a plurality of spacer portions interposed between the lead frame and the heat sink, the interval and parallelism between the lead frame and the heat sink are precisely determined when sealing with the secondary sealing resin after sealing with the primary sealing resin is finished. Furthermore, since the spacer portions are disposed except in the region of the lead frame which is required to have the highest breakdown voltage with the heat sink, it is not necessary to apply complicated bending process to the lead frame to ensure the breakdown voltage between the lead frame and the heat sink.

According to the device of the fifth aspect, the plurality of spacer portions provided being divided at four or more portions facilitate the flow of the liquid secondary sealing resin when sealing with the secondary sealing resin.

According to the device of the sixth aspect, the flat surface of the heat sink faces in parallel the region in the second main surface including the portion corresponding to the power semiconductor element and the secondary sealing resin with excellent thermal conductivity is put between those facing each other, which provides good heat radiation efficiency. Furthermore the spacer portions interposed between the lead frame and the heat sink abut on the retracted surface of the heat sink, so that the creeping distance between the lead frame and the heat sink is long. This enlarges freedom in selecting position of the spacer portions.

According to the device of the seventh aspect, the body of the primary sealing resin which buries the power semiconductor element in close contact with the first main surface is covered with the secondary sealing resin, which provides good close contact between the primary sealing resin and the secondary sealing resin. Furthermore, since the projection reaching the surface of the secondary sealing resin at its top end is formed on the surface of the body from its one end to the other, the projection abuts on the inner wall surface of the mold when sealing the secondary sealing resin after sealing with the primary sealing resin is completed, to block one of the flowing paths of the liquid secondary sealing resin.

As a result, the flow of the sealing resin invading the narrow blank between the lead frame and the heat sink is limited in one direction. Accordingly, voids of the sealing resin are not liable to form in this blank and good electric insulation is ensured between the lead frame and the heat sink.

According to the device of the eighth aspect, the transverse section of the projection is shaped so that one point of the top end projects more than any points in the transverse section, such as a triangle with a sharp top end, so that "burr" will not attach to the top end of the projection after the resin sealing process is finished. Accordingly, the work process for removing the "burr" is eliminated, improving the efficiency of manufacturing.

According to the device of the ninth aspect, the heat sink arranged to selectively face the region including the portion corresponding to the power semiconductor element in the second main surface and the secondary sealing resin with excellent thermal conductivity put between those facing each other allow high heat radiation efficiency.

Also, the block portion forming part of the primary sealing resin and the heat sink are arranged almost parallel on the second main surface side of the lead frame and the block portion occupies the main part of the sealing resin located on the second main surface side. That is to say, the expensive heat sink is reduced in volume and replaced by the inexpensive primary sealing resin. This reduces the manufacturing cost.

According to the device of the tenth aspect, since the end portion of the block portion is exposed to the outside, the block portion can be used as a spacer for determining the interval between the lead frame and the heat sink by causing the end of the block portion to abut on the inner wall surface of the mold when sealing with the secondary sealing resin after sealing with the primary sealing resin is completed.

According to the device of the eleventh aspect, since the body portion of the primary sealing resin which buries the power semiconductor element in close contact with the first main surface is covered with the secondary sealing resin, the close contact between the primary sealing resin and the secondary sealing resin is good. Furthermore, since the block portion extends to cross the sealing resin located on the second main surface side from the one end to the other along the second main surface, the end of the block portion abuts on the inner wall surface of the mold to block one of the flow paths of the liquid secondary sealing resin when sealing the secondary sealing resin after sealing the primary sealing resin is completed.

As a result, the flow of the sealing resin invading the narrow gap between the lead frame and the heat sink is limited in one direction. Accordingly, voids of the sealing resin are not liable to form in this gap, which secures good electric insulation between the lead frame and the heat sink.

According to the device of the twelfth aspect, the block portion which is a part of the primary sealing resin is covered with the secondary sealing resin, which provides good close contact between the primary sealing resin and the secondary sealing resin. Furthermore, since a part of the end of the block portion abuts on the heat sink, the block portion functions as a spacer for determining the interval between the lead frame and the heat sink when sealing the secondary sealing resin after sealing the primary sealing resin. Furthermore, since the portion where the end of the block portion abuts on the heat sink is disposed except in the region facing the region of the lead frame required to have the highest breakdown voltage with the heat sink, it is not necessary to apply complicated bending work to the lead frame to ensure a breakdown voltage between the lead frame and the heat sink.

According to the device of the thirteenth aspect, the flat surface of the heat sink faces in parallel the region including the portion corresponding to the power semiconductor element and the secondary sealing resin with excellent thermal conductivity is put between those facing each other, which provides good heat radiation efficiency. Furthermore, since the block portion interposed between the lead frame and the heat sink abuts on the retracted surface of the heat sink, the creeping distance between the lead frame and the heat sink is long. Accordingly, freedom is increased in selecting the position where the block portion abuts on the heat sink.

According to the device of the fourteenth aspect, the primary sealing resin has the spacer portion interposed between the lead frame and the heat sink, which facilitates determining the interval and parallelism between the lead frame and the heat sink when sealing the secondary sealing resin after sealing the primary sealing resin. Furthermore, the spacer portion is disposed except in the region of the lead frame required to have the highest breakdown voltage with the heat sink, so that it is not necessary to apply complicated bending process to the lead frame to secure a breakdown voltage between the lead frame and the heat sink.

According to the device of the fifteenth aspect, since it has the controlling semiconductor element for controlling the power semiconductor element, it is not necessary to connect a controlling semiconductor element or a corresponding circuit to the outside of the device. Furthermore, since the controlling semiconductor element and the power semiconductor element are arranged adjacent on one lead frame, the reliability of operation is high. That is to say, it provides the advantage that the utility of the device is high.

First, it is an object of the present invention to provide a semiconductor device with no possibility of a decrease in insulation in the lead frame due to peeling at the interface between the primary sealing resin and the secondary sealing resin. Second, it is an object of the present invention to provide a semiconductor device capable of ensuring a breakdown voltage between the lead frame and the heat sink without complicatedly bending the lead frame. Third, it is an object of the present invention to provide a semiconductor device capable of compatibly enhancing the thermal conductivity and the electric insulation between the lead frame and the heat sink. Fourth, it is an object of the present invention to provide a semiconductor device capable of reducing the amount of expensive sealing resin with excellent thermal conductivity to reduce the cost.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

First, a semiconductor device of a first preferred embodiment will be described.

1-1. Circuit Structure

Figure 2:
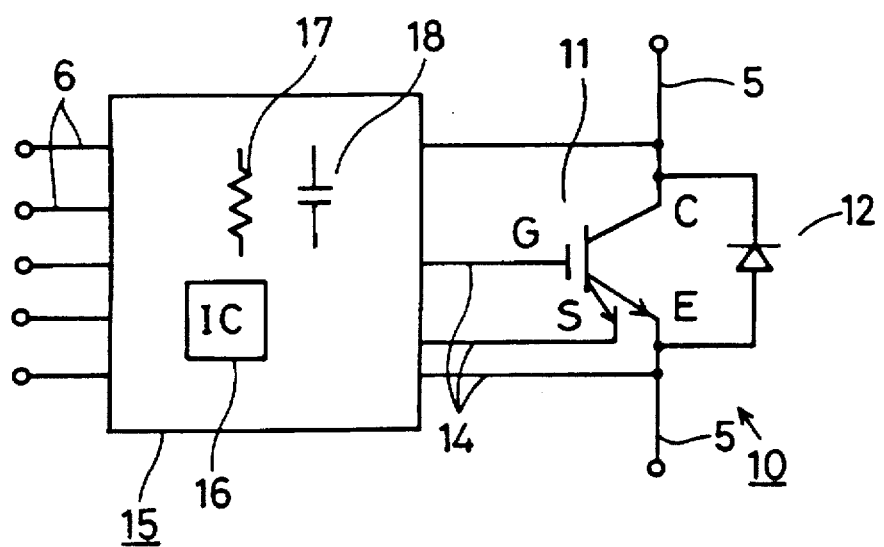
FIG. 2 is a circuit diagram of the device of FIG. 1

FIG. 2 is a circuit diagram showing the circuit structure of a semiconductor device according to this preferred embodiment. This device 101 includes a power circuit 10 having a power semiconductor element modulation-controlling the flow of the main current charged with supply of power to the load and a control circuit controlling operation of the power semiconductor element.

The power circuit 10 includes an IGBT element 11 as a power semiconductor element and a free wheel diode 12. The IGBT element 11 conducts and cuts off (i.e., switches) the main current flowing from the collector electrode C to the emitter electrode E in response to the gate voltage signal inputted to the gate electrode G. This main current is supplied to an external load through the external terminals 5 connected to the collector electrode C and the emitter electrode E. The free wheel diode 12 connected to the IGBT element 11 in the inverse-parallel connection serves to prevent application of excessive reverse current to the IGBT element 11.

The control circuit 15 connected to the power circuit 10 through a plurality of interconnections 14 includes the controlling semiconductor element 16 as an integrated circuit element playing the main role in controlling the IGBT element 11, together with a resistance element 17, a capacitance element 18, etc. These elements form a driving circuit and a protection circuit. The driving circuit is a circuit portion the control circuit for transmitting the gate voltage signal to the gate electrode G in response to the control signal inputted to one of the plurality of external terminals 6. The protection circuit is a circuit portion for monitoring the operational environment of the IGBT element 11 to prevent damage to the IGBT element 11 when an abnormality occurs.

The protection circuit shown in FIG. 2 monitors the voltage between the collector electrode C and the emitter electrode E, i.e., the collector-emitter voltage and, when the voltage becomes too large above a certain reference value, it drives the gate electrode G to cut off the IGBT element 11 irrespective of the external control signal. The protection circuit also monitors the weak current flowing in the sense electrode S in proportion to the main current flowing in the IGBT element 11, i.e., the sense current, and when the main current becomes too large above a certain reference value, it drives the gate electrode G to cut off the IGBT element 11 irrespective of the external control signal.

Furthermore, when an excessive voltage or an excessive current occurs, the protection circuit of FIG. 2 transmits a signal indicating the occurrence of the abnormality to the outside through the external terminal 6. This way, the protection circuit serves to protect the IGBT element 11 from damage caused by an abnormality such as an excessive voltage and an excessive current, for example.

1-2. Entire Structure

Figure 3:
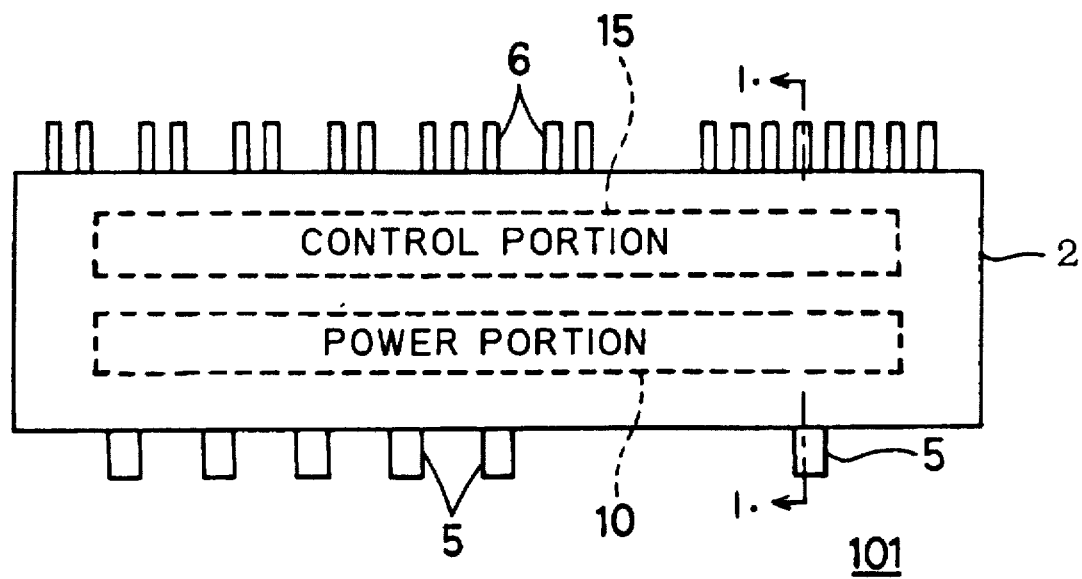
FIG. 3 is a plan view of the device of FIG. 1.
Figure 4:
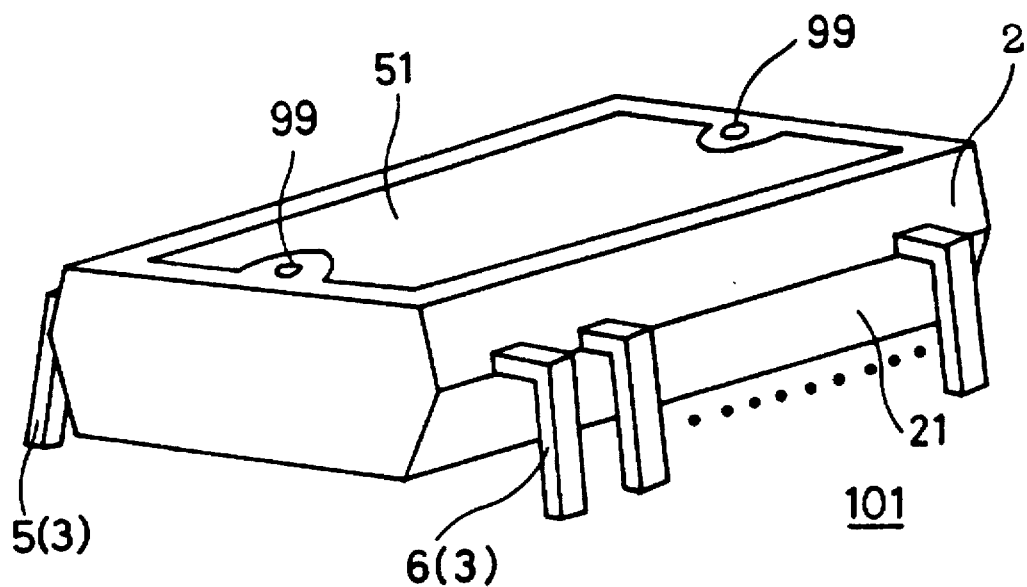
FIG. 4 is a perspective view of the device of FIG. 1.

FIG. 3 and FIG. 4 are a top view and a perspective view seen from the bottom of the device 101, respectively. As shown in the figures, in the device 101, the external terminals 5 and 6 protrude to the outside from the side walls of the electrically insulating sealing resin 2. The one main surface of the heat sink 51 is exposed in the bottom of the sealing resin 2. When used, the device 101 is fixed to an external radiation fin having a flat surface. At this time, the exposed surface of the heat sink 51 comes in surface contact with the flat surface of the radiation fin to efficiently radiate the loss of heat generated in the IGBT element 11 etc. to the outside. The sealing resin 2 has a pair of through holes 99 so that the device 101 can easily be fixed to the radiation fin with screws.

As shown in FIG. 3, the sealing resin 2 seals the elements of the power circuit 10 and the elements of the control circuit 15. As exemplified in FIG. 3, the external terminals 5 and the external terminals 6 protrude from one and the other of the two opposite side walls of the sealing resin 2 forming an almost rectangular prism, respectively. In the sealing resin 2, the control circuit 15 occupies the region close to the external terminals 6 and the power circuit 10 occupies the region close to the external terminals 5.

Figure 1:
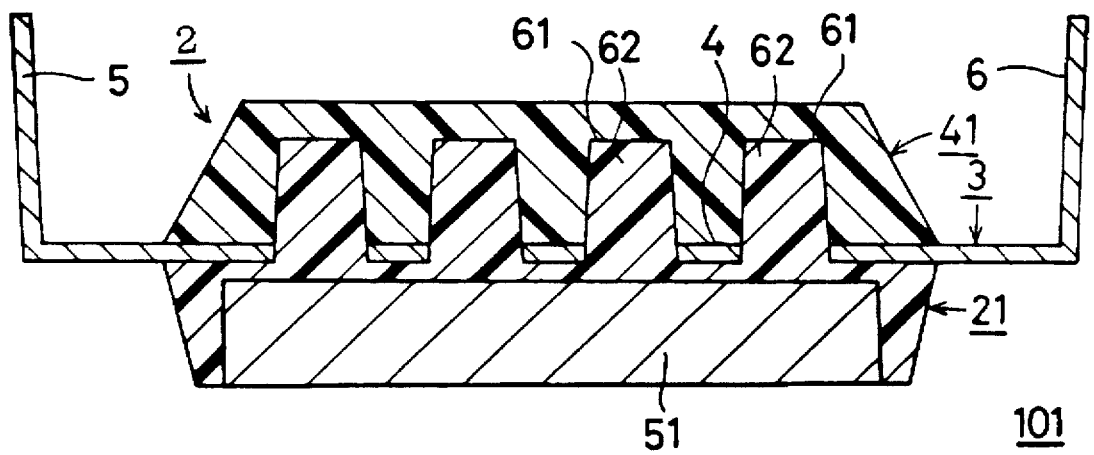
FIG. 1 is a front sectional view of a device of a first preferred embodiment.

FIG. 1 is a front sectional view of the device 101 taken along the line A—A in FIG. 3. In the device 101, the various elements included in the above-described control circuit 15 and power circuit 10 are soldered (not shown) in a plurality of positions on the sheet-like lead frame 3 substantially formed of a metal with good electric conductivity such as copper. The lead frame 3 has the pattern configuration, which forms the interconnection pattern 4 of the control circuit 15 and the power circuit 10 including the interconnections 14 and also forms the external terminals 5 and 6.

The heat sink 51 is provided to face the bottom main surface of the lead frame 3 on the opposite side to its top main surface on which the various elements are provided (the element mounting surface). The heat sink 51 is like a sheet and is substantially formed of a metal with good thermal conductivity such as aluminum or copper, for example. The sealing resin 2 seals the part of the lead frame 3 corresponding to the interconnection pattern 4, the various elements provided on the interconnection pattern 4, and the heat sink 51. The sealing resin 2 protects the interconnection pattern 4 and the elements thereon from the external moisture etc.

As shown in FIG. 1, the sealing resin 2 includes two parts, the primary sealing resin 41 and the secondary sealing resin 21. That is to say, the sealing resin 2 has the double-mold structure. The primary sealing resin 41 is in close contact with the top main surface of the lead frame 3 and buries the elements thereon.

A small gap is provided between the lead frame 3 and the heat sink 51. The secondary sealing resin 21 is in close contact with the bottom main surface of the lead frame 3 and it also fills the gap. The secondary sealing resin 21 put in this gap serves to electrically insulate the lead frame 3 and the heat sink 51 and to well transmit the loss of heat generated in the IGBT element 11 from the lead frame 3 to the heat sink 51. At the same time the secondary sealing resin 21 also serves to fixedly couple the lead frame 3 and the heat sink 51.

The secondary sealing resin 21, which is for filling the gap between the lead frame 3 and the heat sink 51, is formed of a material with especially excellent thermal conductivity and fluidity in sealing as compared with the primary sealing resin 41, where an epoxy resin with filler of silicon nitride mixed therein is selected as its material, for example. On the other hand, an ordinary epoxy resin at a relatively low price is used as the primary sealing resin 41. This way, as the sealing resin 2 has two parts of different materials, the used amount of the expensive resin is reduced to reduce the manufacturing cost.

In the sealing process, after the sealing with the primary sealing resin 41 is completed and stiffness is provided to the lead frame 3, the secondary sealing resin 21 is subjected to sealing. This provides the advantage that precise adjustment of the gap between the lead frame 3 and the heat sink 51, which is filled with the secondary sealing resin 21, is easy.

1-3. Configuration of the Interface of the Sealing Resin

As shown in FIG. 1, the secondary sealing resin 21 has the portion filling the gap between the lead frame 3 and the heat sink 51 as described above, and it also has the projections 62 projecting on the top main surface side of the lead frame 3 through the blanks of the lead frame 3 having the pattern configuration. The projections 62 are integrally coupled with the portion filling the gap between the lead frame 3 and the heat sink 51.

The primary sealing resin 41 has the concaves 61 corresponding to the projections 62. The projections 62 and the concaves 61 are in close contact with each other. In order to form the projections 62 and the concaves 61 in close contact with each other, first, certain parts of the primary sealing resin 41 are formed into the shape of the concaves 61 in the process of sealing with the primary sealing resin 41. Subsequently, it is sealed with the secondary sealing resin 21 and then the projections 62 in close contact with the concaves 61 are formed as part of the secondary sealing resin 21.

Figure 5:
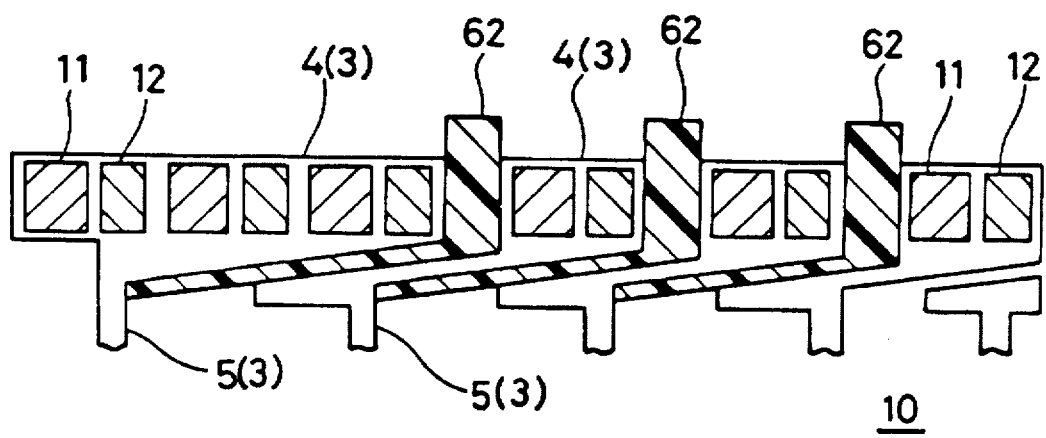
FIG. 5 is a fragmentary plan view of the lead frame of the device of FIG. 1.
Figure 6:
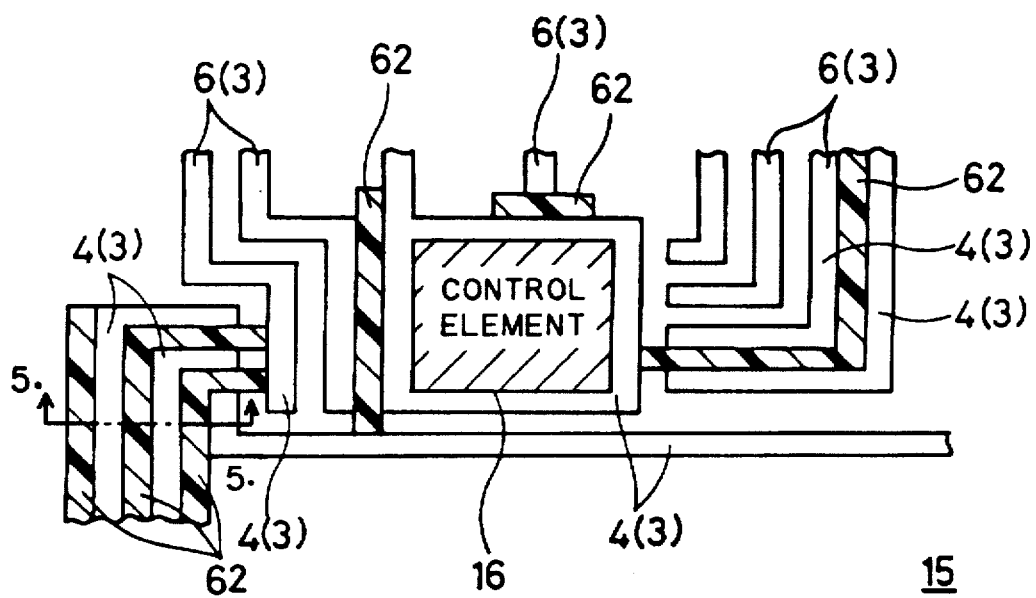
FIG. 6 is a fragmentary plan view of the lead frame of the device of FIG. 1.

FIG. 5 and FIG. 6 show the plane configuration of the projections 62. FIG. 5 is a fragmentary plan of the lead frame 3, which particularly shows the portion forming the power circuit 10. In FIG. 5, the portions in the interconnection pattern 4 provided with the hatching and the characters 11 and 12 show portions in which the IGBT element 11 and the free wheel diode 12 are fixed, respectively.

FIG. 6 is a plan view showing the part of the lead frame 3 forming the control circuit 15. In FIG. 6, the portion in the interconnection pattern 4 provided with the hatching and the character 16 shows the portion in which the controlling semiconductor element 16 is affixed.

As shown in FIG. 5 and FIG. 6, the projections 62 are disposed in the blanks of the lead frame 3. That is to say, the projections 62 are formed just like barriers which separate parts adjacent each other with the blanks therebetween in the lead frame 3. As exemplified in FIG. 5 and FIG. 6, the projections 62 do not necessarily have to be formed to fill the entirety of the blanks of the lead frame 3. It is sufficient that they are formed between adjacent parts of the lead frame 3 which are required to have a high breakdown voltage thereacross corresponding to the rated voltage of the device.

Figure 7:
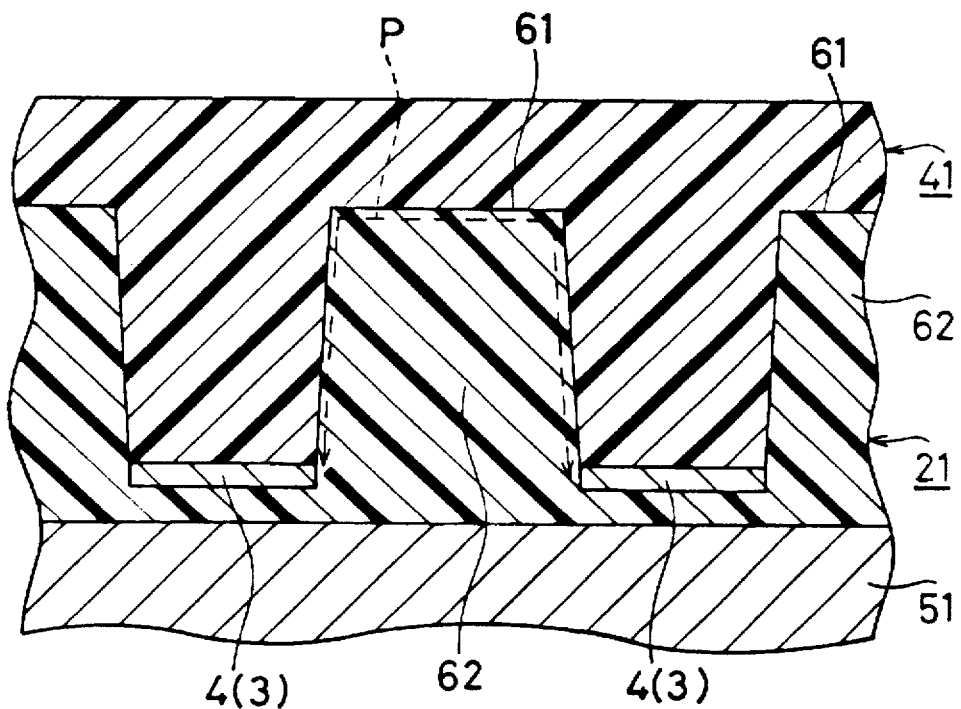
FIG. 7 is an enlarged front sectional view of the device of FIG. 1.
Figure 24:
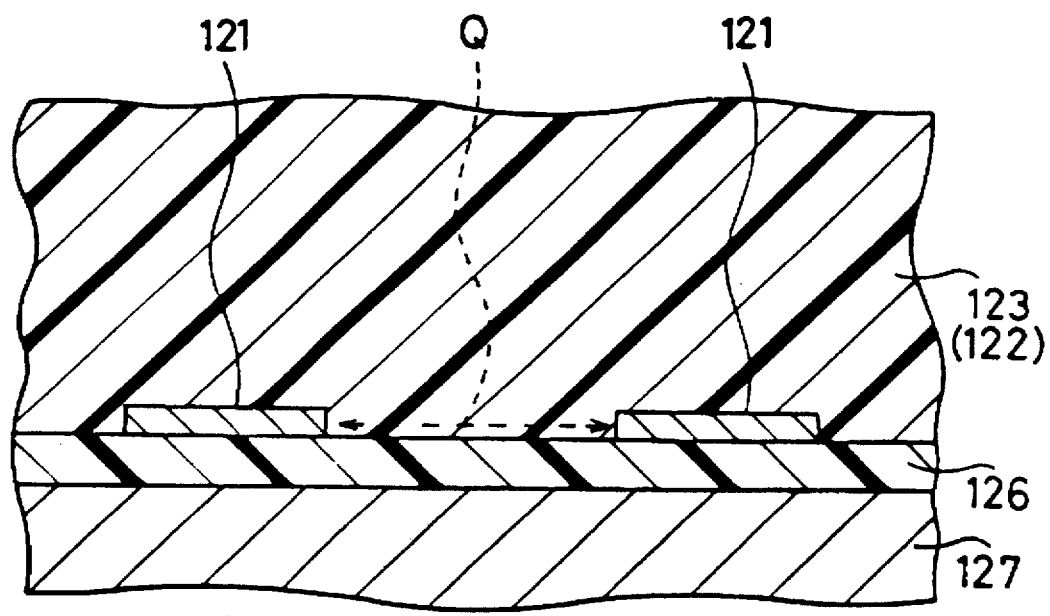
FIG. 24 is an enlarged front sectional view of the device of FIG. 23.

FIG. 7 is a sectional view showing the projection 62 being enlarged. As shown in FIG. 7, the projection 62 is formed in the blank interposed between the two parts of the lead frame 3 required to have a high breakdown voltage. As a result, the creeping distance P along the interface of the primary sealing resin 41 and the secondary sealing resin 21 between the two parts is longer than the creeping distance Q in the conventional device shown in FIG. 24.

Accordingly, even if peeling is caused at the interface between the primary sealing resin 41 and the secondary sealing resin 21, the breakdown voltage of the two parts of the lead frame 3 separated by the projection 62 maintains a value of or above a certain value corresponding to the rated voltage. In this way, the device 101 has the advantage that the breakdown voltage, or insulation, of the lead frame 3 is improved.

Under the lead frame 3, the heat sink 51 is adjacent to it at a small interval. Above the lead frame 3, the primary sealing resin 41 is formed relatively thick. In the device 101, utilizing this condition, the secondary sealing resin 21 protrudes above the lead frame 3 to enhance the breakdown voltage in the lead frame 3 while maintaining the good thermal conductivity between the lead frame 3 and the heat sink 51.

The device 101 in which the interface between the primary sealing resin 41 and the secondary sealing resin 21 has engagement of the projections 62 and the concaves 61 further has the advantage that the peeling itself is not liable to occur at the interface between the primary sealing resin 41 and the secondary sealing resin 21. To suppress the peeling at the interface, it is preferred that the projections 62 and the concaves 61 are appropriately formed also between adjacent parts of the lead frame 3 which does not require a high breakdown voltage.

Furthermore, in the device 101, as formation of the projections 62 and the concaves 61 increases the breakdown voltage in the adjacent portions of the lead frame 3, the blanks formed in the lead frame 3 can be made smaller in thickness. That is to say, the pattern of the lead frame 3 can be made finer to downsize the device.

Moreover, as respectively exemplified in FIG. 1, FIG. 5 to FIG. 7, the projection 62 is formed in close contact with the parts of the lead frame 3 which are separated with a blank therebetween. That is to say, in order to increase the breakdown voltage in the adjacent parts of the lead frame 3, the blank therebetween is utilized to the maximum. This provides the highest breakdown voltage. This is especially advantageous in miniaturizing the lead frame 3.

Preferably, as shown in FIG. 7, a so-called "extraction slope" is formed on the side surface of the projection 62. That is to say, the side surface of the projection 62 is somewhat inclined with respect to the vertical plane so that the projection 62 becomes smaller as it gets closer to the end. Accordingly, the mold used when molding the primary sealing resin 41 can be easily extracted after molding. That is to say, it facilitates the manufacturing process of the device.

1-4. Another Example of Configuration of the Projection

Figure 8:
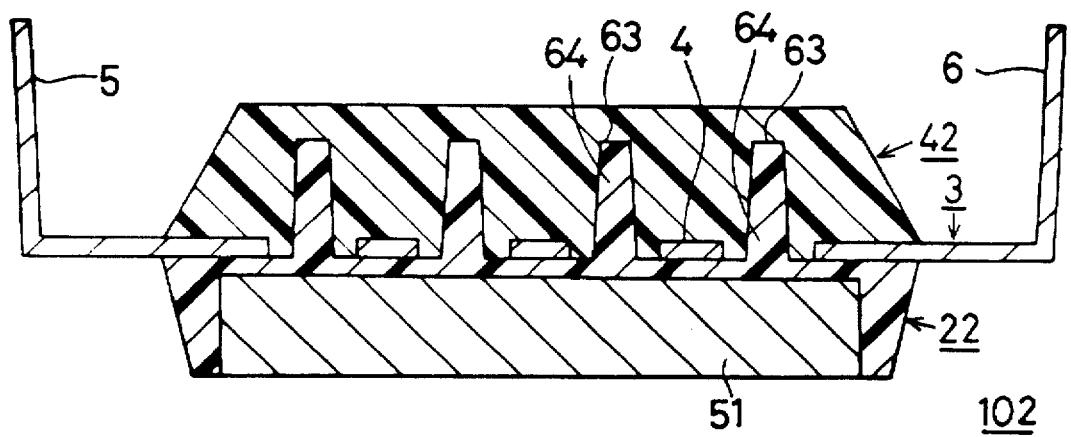
FIG. 8 is a front sectional view of another device of the first preferred embodiment.

FIG. 8 is a front sectional view of a semiconductor device with projections 62 different in shape from those in the device 101. In this device 102, the primary sealing resin 42, the secondary sealing resin 22, the concaves 63 and the projections 64 correspond to the primary sealing resin 41, the secondary sealing resin 21, the concaves 61 and the projections 62 in the device 101, respectively. While the projection 62 is shaped as if it was inserted in close contact in the blank of the lead frame 3 in the device 101, the projection 64 of the device 102 is shaped as if it was inserted in the blank of the lead frame 3 with play. That is to say, the thickness of the projection 64 is set smaller than the width of the blank of the lead frame 3.

Hence, in the device 102, the required amount of the expensive secondary sealing resin is reduced as compared with the device 101 having the same lead frame 3. That is to say, it provides the advantage that the manufacturing cost is low.

2. Second Preferred Embodiment

Figure 9:
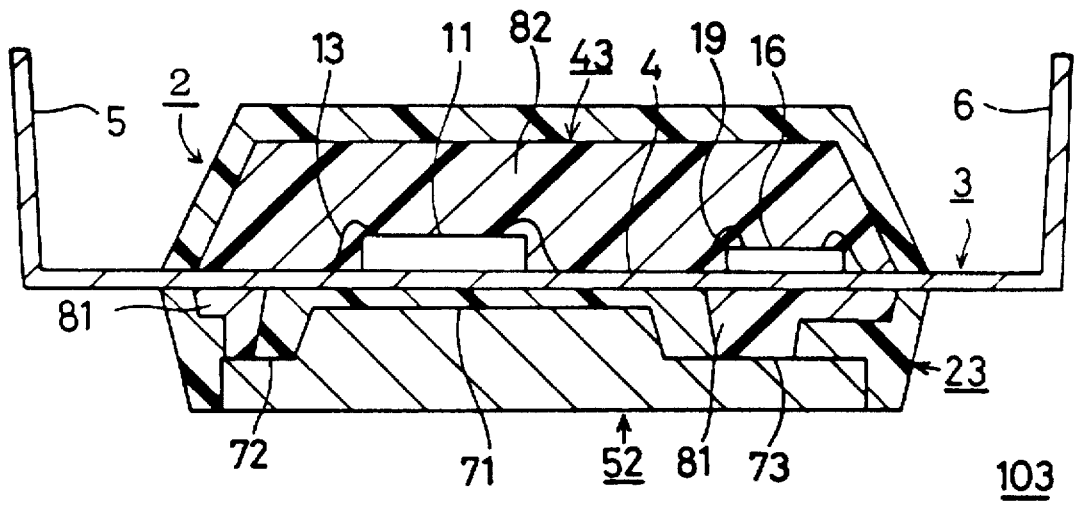
FIG. 9 is a front sectional view of a device of a second preferred embodiment.

FIG. 9 is a front sectional view of a semiconductor device according to a second preferred embodiment. In this device 103, like the device 101, the sealing resin 2 has the double-mold structure. The primary sealing resin 43 has a plurality of spacer portions 81 selectively in close contact with the lower main surface of the lead frame 3 and protruding downward. These spacer portions 81 are interposed between the lead frame 3 and the heat sink 52. This allows the interval and the parallelism between the lead frame 3 and the heat sink 52 to be precisely determined when sealing with the secondary sealing resin 23.

On the upper main surface of the heat sink 52 facing the lead frame 3, the flat surface 71 at a small interval from the lead frame 3 and the retracted surfaces 72 and 73 retracted from the flat surface 71 are formed like steps. The ends of the spacer portions 81 abut on the retracted surfaces 72 and 73. That is to say, the interval between the lead frame 3 and the heat sink 52 is larger in the portions where the spacer portions 81 are interposed.

Figure 10:
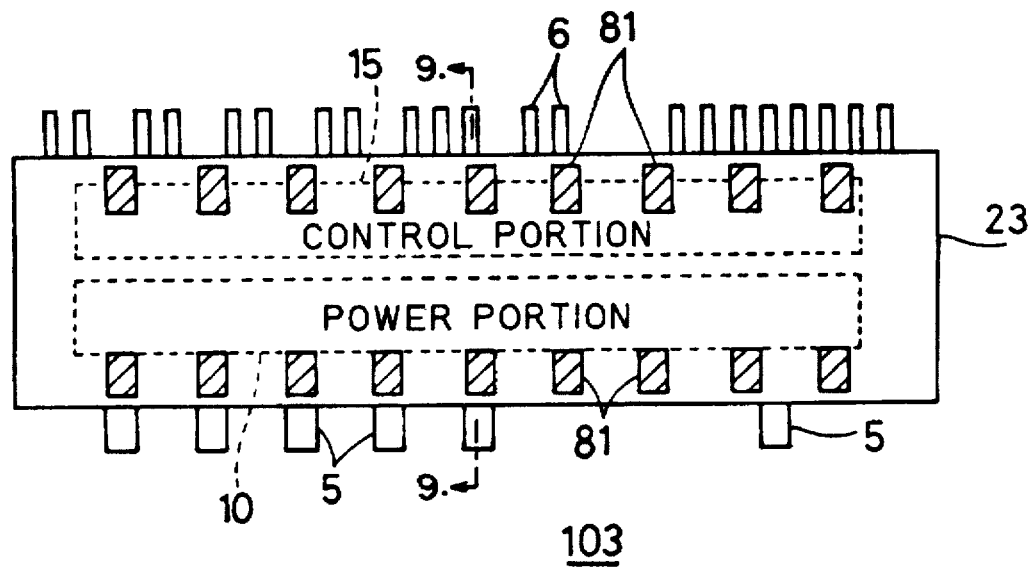
FIG. 10 is a plan view of the device of FIG. 9.

FIG. 10 is a plan view of the device 103 showing an arrangement of the spacer portions 81. FIG. 9 described above corresponds to a sectional view along the line C—C in FIG. 10. The portions shown by the reference character 81 with hatching show the regions occupied by the spacer portions 81 in the lower main surface of the lead frame 3. As shown in FIG. 10, the spacer portions 81 are selectively provided in portions of the lead frame 3 which do not require a high breakdown voltage with respect to the heat sink 52 and where heat generating elements such as the IGBT element 11 are not fixed, such as in the portion where the controlling semiconductor element 16 is fixed.

Returning to FIG. 9, the flat surface 71 is disposed to include the region right facing the heat generating elements such as the IGBT element 11 in the upper main surface of the heat sink 52. The interval between the flat surface 71 and the lead frame 3 is set to a limited small value, similarly to the interval between the upper main surface of the heat sink 51 and the lead frame 3 in the device 101, to keep the thermal conductivity good between the lead frame 3 and the heat sink 52.

In this way, in the device 103 where the spacer portions 81 are selectively provided in portions of the lead frame 3 which do not require a high breakdown voltage with respect to the heat sink 52, it is not necessary to have the creeping distance long between the lead frame 3 and the heat sink 52 along the interface between the spacer portions 81 and the secondary sealing resin 23. This removes the necessity of bending the lead frame 3 like steps as in the conventional device 150.

Furthermore, the spacer portions 81 are disposed off the portions of the lead frame 3 where heat generating elements such as the IGBT element 11 are fixed, and accordingly the flat surface 71 is disposed in the region right facing the heat generating elements, which maintains good heat radiation efficiency.

Moreover, as exemplified in FIG. 9, in the device 103, the secondary sealing resin 23 buries inside not only the spacer portions 81 but also other portions of the primary sealing resin 43, i.e., the body portion 82 covering the upper main surface of the lead frame 3. That is to say, the entirety of the primary sealing resin 43 is covered with the secondary sealing resin 23, and no part of the interface between the primary sealing resin 43 and the secondary sealing resin 23 is exposed to the outside. Accordingly, the close contact between the primary sealing resin 43 and the secondary sealing resin 23 is especially excellent.

Figure 11:
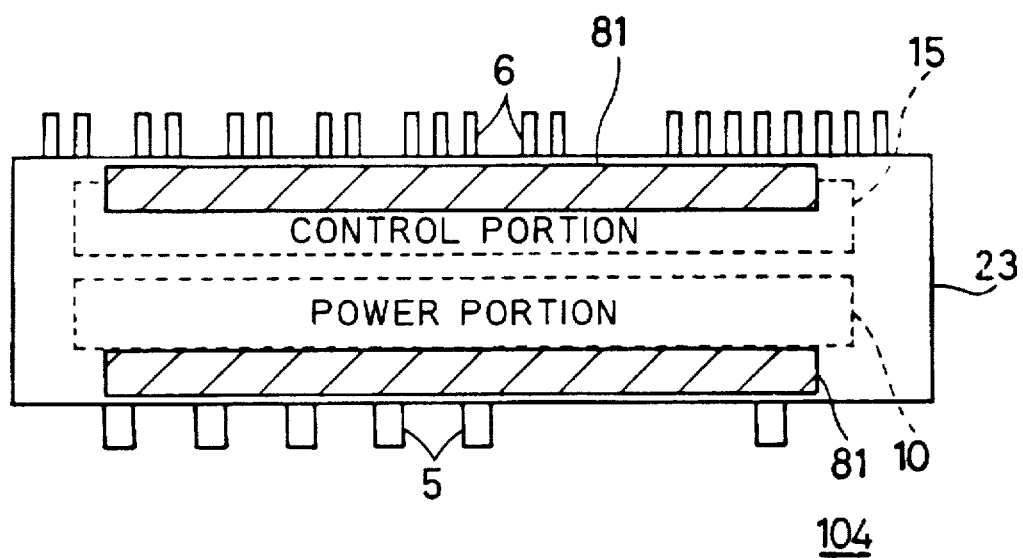
FIG. 11 is a plan view of another device of the second preferred embodiment.

The arrangement pattern of the spacer portions 81 is not limited to the arrangement like a large number of isolated islands as shown in FIG. 10. As shown in the plan of FIG. 11, for example, it may be arranged like two bands along the two lines of external terminals 5 and 6. The arrangement of FIG. 10 can ensure the flow path of the secondary sealing resin 23 everywhere in the process of sealing of the secondary sealing resin 23, which is preferred to keep the flow of the secondary sealing resin 23 good. It is preferred to divide the spacer portions 81 at least in four parts to precisely determine the interval and parallelism between the lead frame 3 and the heat sink 52 and to enhance the fluidity of the secondary sealing resin 23.

In the device 103, steps are formed on the upper main surface of the heat sink 52 with the spacer portions 81 abutting on the retracted surfaces 72 and 73, but the device may be constituted so that the upper main surface of the heat sink 52 has no step like the heat sink 51 (FIG. 1), with the spacer portions 81 interposed in the small gap between the lead frame 3 and the upper main surface of the heat sink 52.

However, the configuration of the spacer portions 81 abutting on the retracted surfaces 72 and 73 has the advantage that the positions of the spacer portions 81 can be enlarged to the region in the lead frame 3 where a breakdown voltage at a certain degree is required with respect to the heat sink 52. That is to say, this increases the freedom in selecting positions of the spacer portions 81.

3. Third Preferred Embodiment

Figure 12:
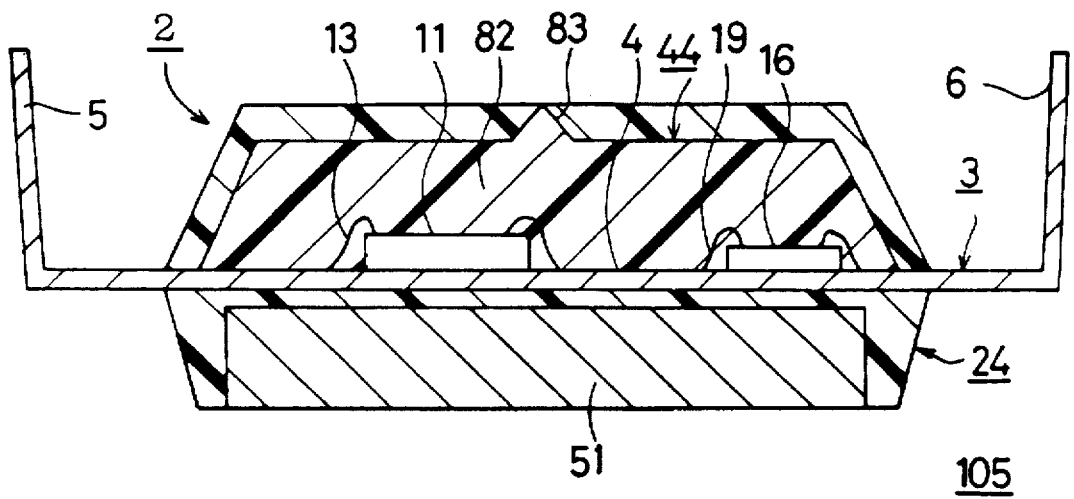
FIG. 12 is a front sectional view of a device of a third preferred embodiment.

FIG. 12 is a front sectional view of a semiconductor device of the third preferred embodiment. In this device 105, like the device 103 etc., the sealing resin 2 has the double-mold structure. The secondary sealing resin 24 is put not only under the lead frame 3 but it also covers the surface of the primary sealing resin 44 which buries the elements on the lead frame 3. The primary sealing resin 44 has a projection 83 with a triangular cross section (transverse section) on its upper surface. The top end of the projection 83 reaches the outer surface of the secondary sealing resin 24.

Figure 13:
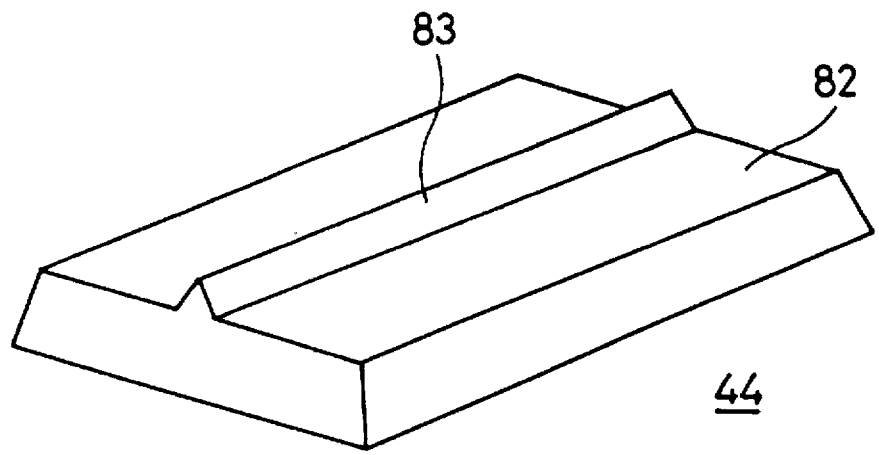
FIG. 13 is a perspective view of the primary sealing resin of the device of FIG. 12.

FIG. 13 is a perspective view of the primary sealing resin 44. As shown in FIG. 13, the primary sealing resin 44 has a body portion 82 almost like a rectangular prism for burying the elements and the projection 83 with a triangle section formed like a line crossing its upper main surface from one end to the other. This projection 83 serves to direct the flow path of the secondary sealing resin 24 in one direction in the sealing process of the secondary sealing resin 24.

Figure 14:
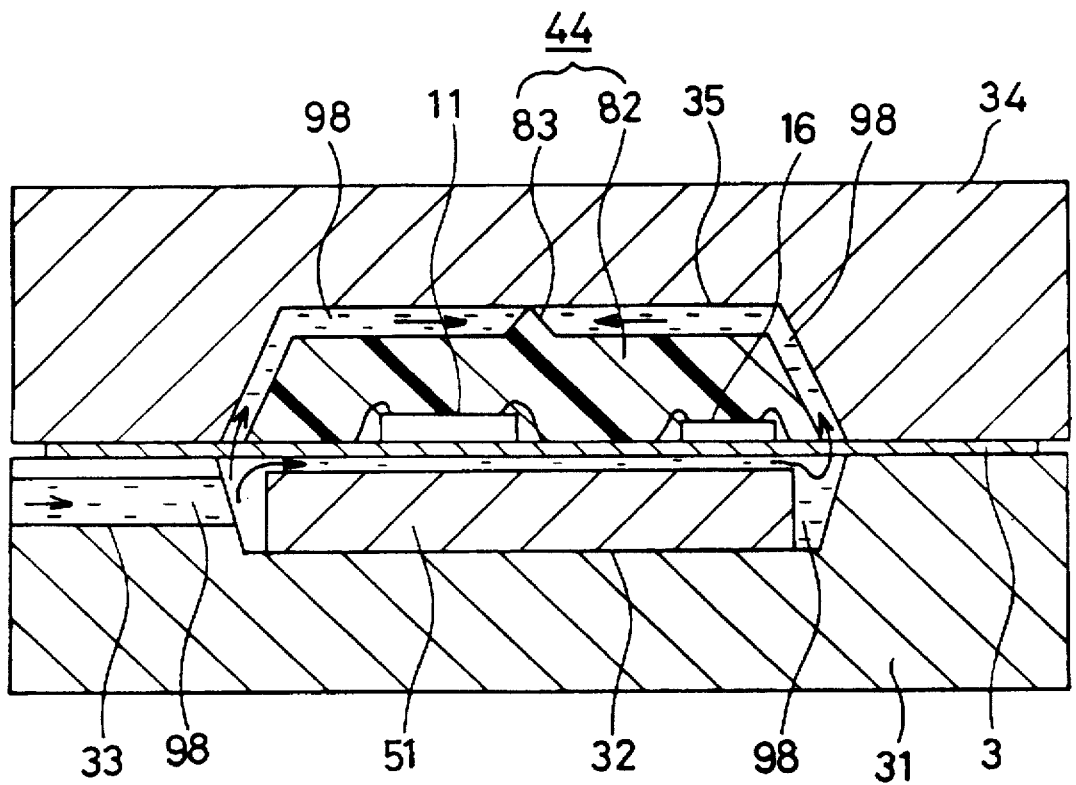
FIG. 14 is a front sectional view showing the resin sealing process of the device of FIG. 12.

FIG. 14 is a sectional view showing the sealing process of the secondary sealing resin 24. This second step of sealing is performed by using the upper mold 34 having the cavity 35 and the lower mold 31 having the cavity 32. During this process, the heat sink 51 is located on the bottom of the cavity 32. The liquid sealing resin 98 is injected through the injection path 33 and heated to be hardened to complete the sealing with the secondary sealing resin 24.

In the process of injecting the liquid sealing resin 98, the sealing resin 98 flows above and under the lead frame 3. The sealing resin 98 flowing above is blocked at the projection 83 because the projection 83 abuts on the inner wall surface of the cavity 35. The sealing resin 98 flowing below passes in the narrow gap between the lead frame 3 and the heat sink 51 to further flow to above the lead frame 3. The flow is stopped at the projection 83 (on the deeper side seen from the injection path 33).

In this way, one of the two flow paths of the sealing resin 98 leading to the narrow gap between the lead frame 3 and the heat sink 51 is blocked because the inner wall surface of the cavity 35 and the projection 83 abut on each other. As a result, the flow of the sealing resin 98 filling the gap between the lead frame 3 and the heat sink 51 is limited in one direction. Hence, voids of the sealing resin 98 are not liable to form in this narrow gap, and electric insulation is ensured as designed between the lead frame 3 and the heat sink 51. That is to say, the reliability of the device is increased.

Figure 15:
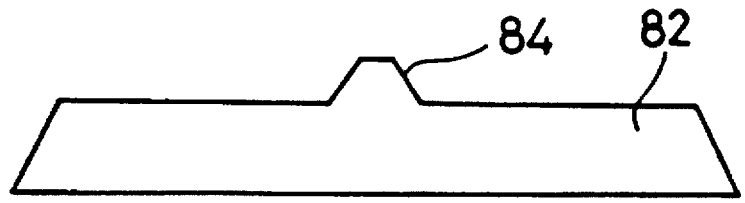
FIG. 15 is a front view of the primary sealing resin of another device of the third preferred embodiment.
Figure 16:
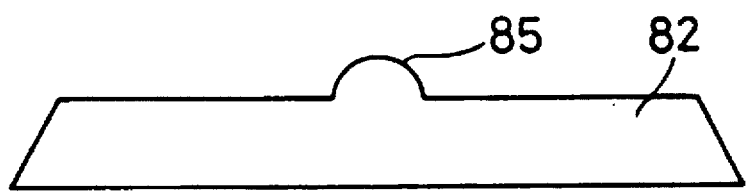
FIG. 16 is a front view of the primary sealing resin of still another device of the third preferred embodiment.
Figure 17:
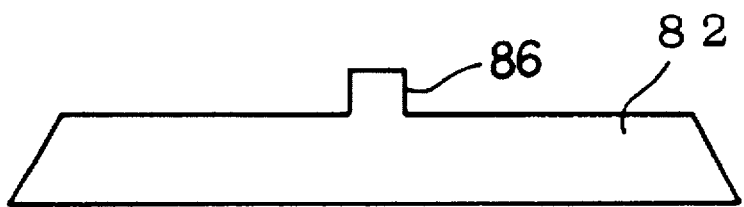
FIG. 17 is a front view of the primary sealing resin of still another device of the third preferred embodiment.

The sectional form of the projection 83 is not limited to the triangular form exemplified in FIG. 12 etc. For example, the projection 83 may be replaced by the projection 84 with a trapezoidal cross section shown in FIG. 15, or by the projection 85 with an arc cross section shown in FIG. 16, or it may be replaced by the projection 86 with a rectangular cross section shown in FIG. 17. With the projection 83 with the triangular cross section or the projection 85 with the arc cross section, "burr" of resin is not liable to attach to the top end of the projection 83, 85 after the two steps of resin sealing is finished, which have the advantage that the postprocessing is simple. Especially, the projection 83 with the triangular sectional form is excellent. The projections 84 and 86 which come in surface contact with the inner wall surface of the cavity 35 are superior to other projections 83 and 85 in respect of the function of blocking the flow path of the sealing resin 98.

4. Fourth Preferred Embodiment

Figure 18:
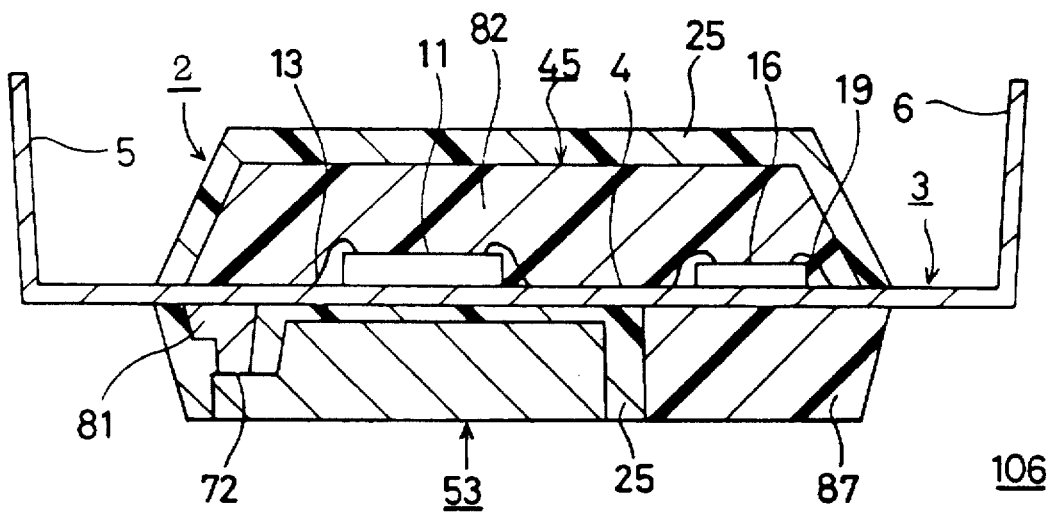
FIG. 18 is a front sectional view of a device of a fourth preferred embodiment.

FIG. 18 is a front sectional view of a semiconductor device of the fourth preferred embodiment. In this device 106, like the device 103 and the like, the sealing resin 2 has the double-mold structure. The primary sealing resin 45 has the spacer portion 81 and the projecting block portion 87 which are in close contact with the lower main surface of the lead frame 3, in addition to the body portion 82 which buries the elements on the lead frame 3. The secondary sealing resin 25 is not only put under the lead frame 3 but it also covers the surface of the body portion 82 of the primary sealing resin 45.

In the device 106, the heat sink 53 is not provided to face the almost entire region of the part of the lead frame 3 corresponding to the interconnection pattern 4, but it is provided to face the limited region including the portion where the heat generating elements such as the IGBT element 11 are fixed. The block portion 87 is disposed adjacent or close to the end of the heat sink 53 so that it fills the region under the lead frame 3 where the heat sink 53 does not exists. Accordingly, the block portion 87 occupies the main part of the sealing resin 2 provided under the lead frame 3.

The end of the spacer portion 81 abuts on the retracted surface 72 of the heat sink 53, but the bottom of the block portion 87 is exposed alongside of the heat sink 53 in the bottom of the device 106. That is to say, the heat sink 53 and the block portion 87 are arranged in parallel under the lead frame 3. In this way, in the device 106, the heat sink 53 is reduced in volume while maintaining the good radiation efficiency of loss of heat generated from the IGBT element 11 etc., and it is replaced by the low-priced block portion 87, not by the secondary sealing resin 25. Accordingly the device 106 reduces the manufacturing cost.

It is preferred that the block portion 87 is formed like a bar crossing from one end to the other of the sealing resin 2 (along the direction vertical to the paper of FIG. 18). Then the block portion 87 also serves to direct the flow path of the secondary sealing resin 25 into one direction in the sealing process with the secondary sealing resin 25, like the projection 83 of the third preferred embodiment.

Figure 19:
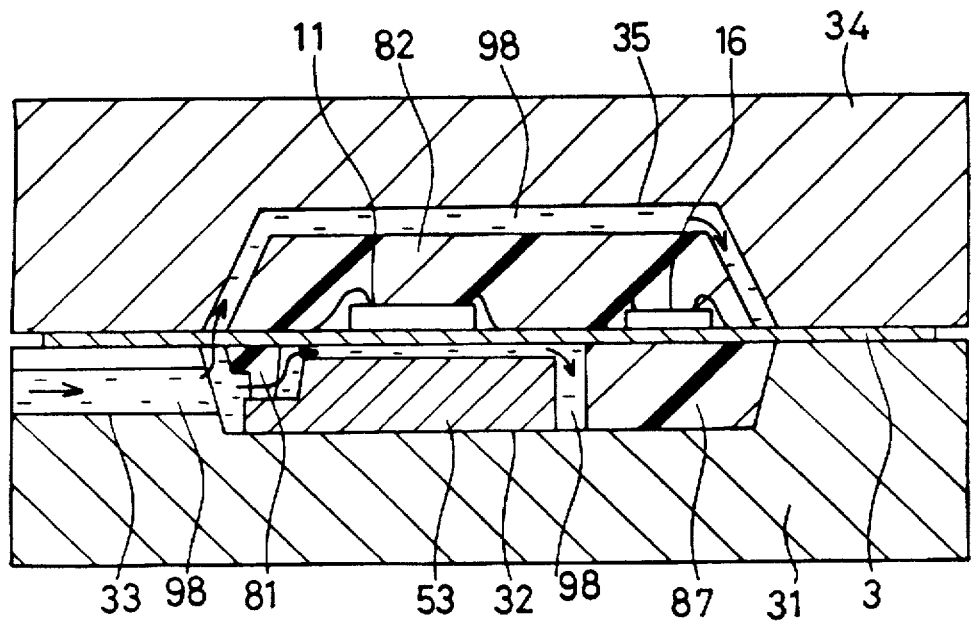
FIG. 19 is a front sectional view showing the resin sealing process of the device of FIG. 18.

FIG. 19 is a sectional view showing the sealing process of the secondary sealing resin 25. In the process of injecting the liquid sealing resin 98, the sealing resin 98 flows separated above and below the lead frame 3. The sealing resin 98 flowing above is blocked before the block portion 87 (at the upper surface of the block portion 87). The sealing resin 98 flowing below passes in the narrow gap between the lead frame 3 and the heat sink 53. The sealing resin 98, passing in this gap, is blocked before the block portion 87 (at the side wall of the block portion 87).

In this way, although the secondary sealing resin 25 covers the surface of the body portion 82 of the primary sealing resin 45, the flow of the sealing resin 98 filling the gap between the lead frame 3 and the heat sink 53 is limited in one direction. Accordingly, voids of the sealing resin 98 are not liable to form in this narrow gap, and electric insulation is ensured as designed between the lead frame 3 and the heat sink 53. That is to say, the reliability of the device is increased.

Furthermore, the block portion 87 abutting on the inner wall surface (bottom) of the cavity 32 of the lower mold 31 on its bottom surface also functions as a spacer portion for determining the interval between the lead frame 3 and the heat sink 53 placed on the inner wall surface of the same cavity 32. That is to say, the block portion 87 cooperates with the spacer portion 81 to precisely determine the interval and parallelism between the lead frame 3 and the heat sink 53 when sealing with the secondary sealing resin 23(98).

The block portion 87 is preferably disposed at an interval from the heat sink 53 as shown in FIG. 19. This enlarges the creeping distance between the lead frame 3 and the heat sink 53 along the interface between the block portion 87 and the secondary sealing resin 25 so that a certain breakdown voltage can be kept therebetween. This is especially important when the block portion 87 is shaped to cross from one end of the sealing resin 2 to the other.

It is the same as the second preferred embodiment that it is preferred that the spacer portion 81 is divided like isolated islands to ensure the flow path of the sealing resin 98.

Figure 20:
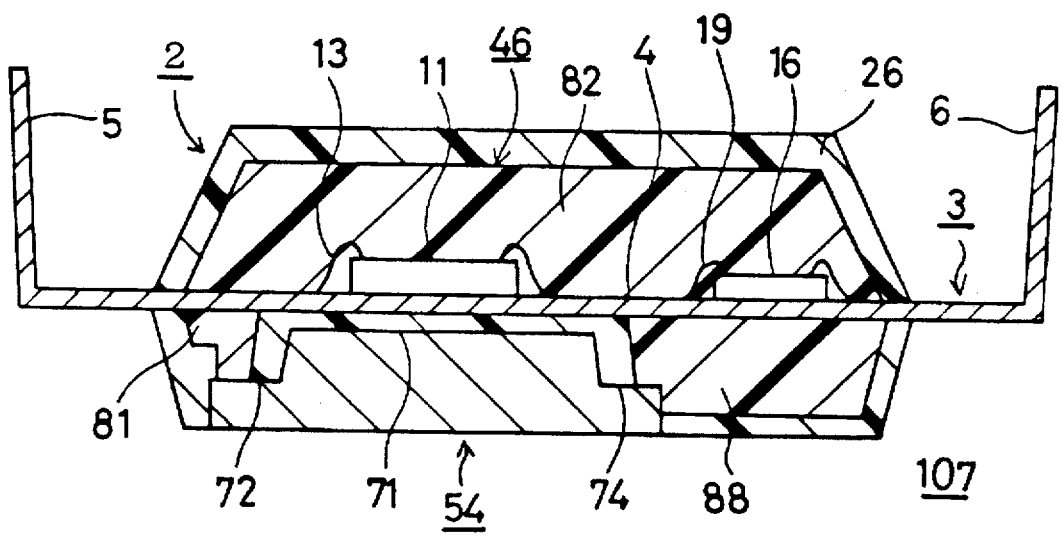
FIG. 20 is a front sectional view of another device of the fourth preferred embodiment.

Next, some modified examples of the device 106 will be described. In the device 107 exemplified in FIG. 20, the block portion 88 which is a part of the primary sealing resin 46 is covered with the secondary sealing resin 26. A part of the bottom of the block portion 88 abuts on the retracted surface 74 of the heat sink 54 to function as a spacer portion and function to block the flow path of the sealing resin 98.

In order to enlarge the creeping distance between the lead frame 3 and the heat sink 54, at least the part of the block portion 88 which abuts on the heat sink 54 is disposed except in the region facing the region in the lead frame 3 which requires a high breakdown voltage with the heat sink 54, similarly to the spacer portion 81.

In this device 107, as the surface of the primary sealing resin 46 including the block portion 88 is covered with the primary sealing resin 26, the close contact between the primary sealing resin 46 and the secondary sealing resin 26 is excellent. Also, the heat sink 54 and the block portion 88 are arranged almost parallel below the lead frame 3, though they overlap in part, and the block portion 88 occupies the main part of the sealing resin 2 under the lead frame 3. This provides the effect of reducing the manufacturing cost similarly to the device 106.

Figure 21:
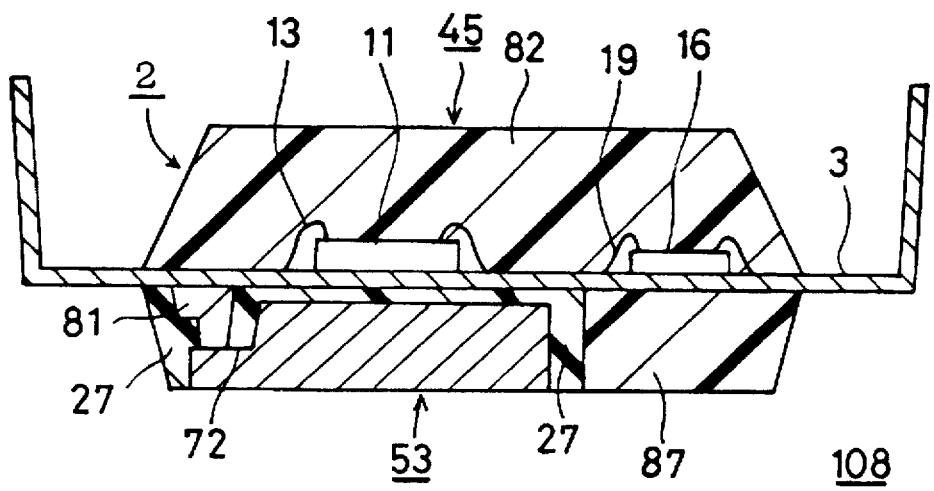
FIG. 21 is a front sectional view of still another device of the fourth preferred embodiment.

In the device 108 shown in FIG. 21, the secondary sealing resin 27 does not cover the surface of the body portion 82 of the primary sealing resin 45, but it is put only under the lead frame 3. In this case, the block portion 87 is not required to have the function of blocking the flow path of the sealing resin 98. Accordingly, the block portion 87 may be divided like islands, for example. That is to say, it provides the advantage that the freedom is large in designing the block portion 87.

The device 108 also provides the effect of reducing the manufacturing cost, like the device 106. Furthermore, as the secondary sealing resin 26 required to cover the surface of the body 82 is reduced, the manufacturing cost is further reduced.

Figure 22:
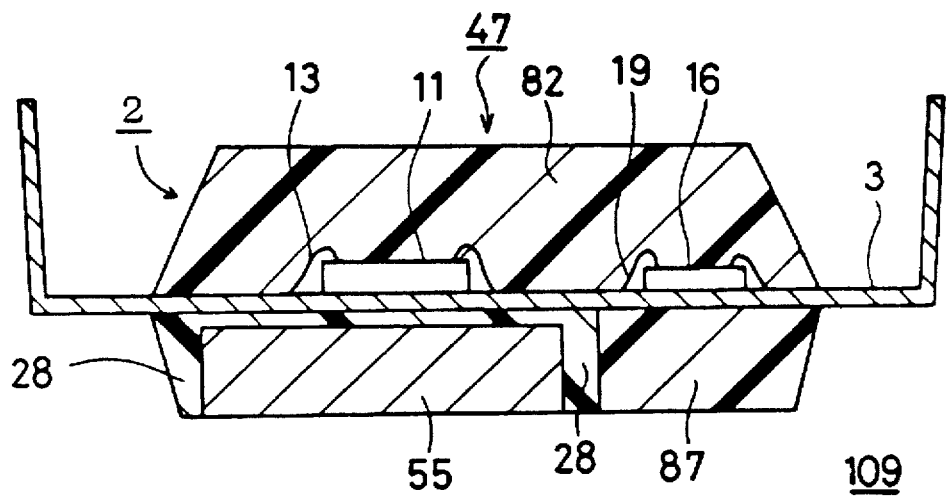
FIG. 22 is a front sectional view of still another device of the fourth preferred embodiment.
Figure 23:
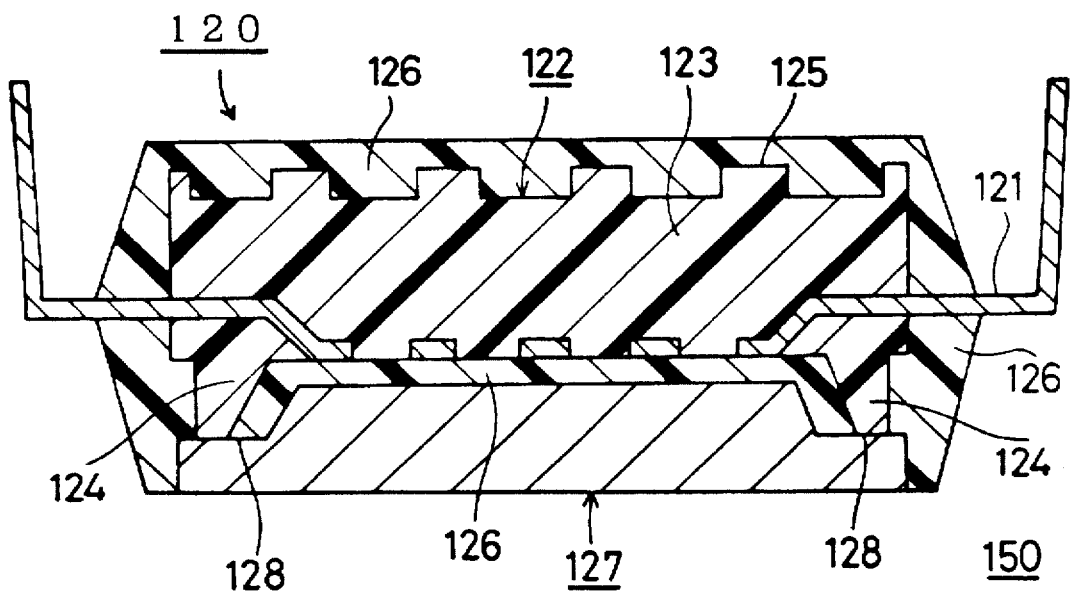
FIG. 23 is a front sectional view of a conventional device.

In the device 109 shown in FIG. 22, similarly to the device 108, the secondary sealing resin 28 is put only under the lead frame 3. It is, however, characteristically different from the device 108 in that the spacer portion 81 as a part of the primary sealing resin 47 is not provided between the lead frame 3 and the heat sink 55. This device 109 in which the heat sink 55 and the block portion 87 are arranged almost parallel to each other under the lead frame 3 and the block portion 87 occupies the main part of the sealing resin 2 under the lead frame 3 also provides the effect of reducing the manufacturing cost, similarly to the device 106.

5. Modified Examples (1) Although the preferred embodiments described above have exemplified devices constituted to individually solve the plurality of problems of the conventional device 150, the characteristic points of the respective preferred embodiments can generally be applied in appropriate combination. For example, it is possible to make a device having the projections 62 (FIG. 1) of the first preferred embodiment, the spacer portions 81 (FIG. 9) of the second preferred embodiment, and the projection 83 (FIG. 13) of the third preferred embodiment.

(2) Although the above-described preferred embodiments have shown preferred examples in which the control circuit 15 forms a driving circuit and a protection circuit, generally, the elements included in the control circuit 15 such as the controlling semiconductor element 16 may form only the driving circuit. In this case, in the circuit diagram of FIG. 2, the IGBT element 11 does not need the sense electrode S. In the plurality of interconnections 14, the interconnections coupling the collector electrode C and the sense electrode S with the control circuit 15 are not required. Furthermore, parts of the external terminals 6 are not required.

Furthermore, generally, it can be applied to a semiconductor device having only the power circuit 10 but no control circuit 15. Moreover, it is also applicable to a semiconductor device having only the power semiconductor element such as the IGBT element 11 as a circuit element.

While the invention has been described in detail, the foregoing description is in all aspects illustrative and not restrictive. It is understood that numerous other modifications and variations can be devised without departing from the scope of the invention.

We claim:

1. A semiconductor device, comprising:
   a lead frame shaped like a sheet with electrical conductivity having first and second main surfaces, having pattern configuration, and having external terminals protruding outward provided therearound;
   a power semiconductor element fixed on said first main surface;
   a heat sink with terminal conductivity provided to face said second main surface with a gap therebetween; and
   a sealing resin being electrically insulating and sealing said power semiconductor element, said lead frame, and said heat sink;
   wherein said sealing resin has a primary sealing resin and a secondary sealing resin with more excellent thermal conductivity than that of the primary sealing resin,
   said secondary sealing resin has a gap filling portion filling said gap in close contact with said second main surface and a projecting portion integrally coupled with said gap filling portion and extending from said second main surface of said lead frame to pass through a blank defined within said pattern configuration of said lead frame to protrude like a wall on said first main surface side of said lead frame, and
   said primary sealing resin extends between said projecting portion of said secondary sealing resin to said first main surface and buries said power semiconductor element, and is in close contact with said projecting portion.

2. The semiconductor device according to claim 1, wherein said blank through which said projecting portion passes includes a blank portion separating parts of said lead frame requiring a highest breakdown voltage thereacross in said lead frame.

3. The semiconductor device according to claim 2, wherein a thickness of said projecting portion at a portion passing through said blank coincides with a width of said blank.

4. A semiconductor device, comprising:
   a lead frame shaped like a sheet with electrical conductivity having first and second main surfaces, having pattern configuration, and having external terminals protruding outward provided therearound;
   a power semiconductor element fixed on said first main surface;
   a heat sink with thermal conductivity provided to face said second main surface with a gap therebetween; and
   a sealing resin being electrically insulating and sealing said power semiconductor element, said lead frame, and said heat sink;
   wherein said lead frame is flat throughout a portion thereof sealed in by said sealing resin and said sealing resin has a primary sealing resin and a secondary sealing resin with heat conductivity more excellent than that of said primary sealing resin;
   said primary sealing resin has a body portion in close contact with said first main surface and burying said power semiconductor element and a plurality of spacer portions being like projections selectively in close contact with said second main surface and having its end portion abutting on said heat sink;
   said secondary sealing resin has a portion which is selectively in close contact with a region including a portion corresponding to said power semiconductor element in said second main surface and fills a portion of said gap defined between said region and said heat sink; and
   said plurality of spacer portions are disposed off a region required to have a highest breakdown voltage with respect to said heat sink in said lead frame.

5. The semiconductor device according to claim 4, wherein said plurality of spacer portions are arranged being divided at four or more portions.

6. The semiconductor device according to claim 5, wherein said heat sink has a flat surface facing in parallel to said region including the portion corresponding to said power semiconductor element in said second main surface and a retracted surface retracted from said flat surface and abutting on said plurality of spacer portions.

7. A semiconductor device, comprising:
   a lead frame shaped like a sheet with electrical conductivity having first and second main surfaces, having pattern configuration, and having external terminals protruding outward provided therearound;
   a power semiconductor element fixed on said first main surface;
   a heat sink with thermal conductivity provided to face said second main surface with a gap therebetween; and
   a sealing resin being electrically insulating and sealing said power semiconductor element, said lead frame, and said heat sink;
   wherein said sealing resin has a primary sealing resin and a secondary sealing resin with heat conductivity more excellent than that of said primary sealing resin;
   said primary sealing resin has a body portion in close contact with said first main surface and burying said power semiconductor element;
   said secondary sealing resin has a portion filling said gap in close contact with said second main surface and a portion covering said body portion; and
   said body portion has a projection linearly crossing from one end to the other on its surface, a top end of said projection reaching a surface of said secondary sealing resin covering said body portion.

8. The semiconductor device according to claim 7, wherein a transverse section of said projection is shaped so that one point of said top end projects from any point in said transverse section.

9. The semiconductor device according to claim 8, wherein the shape of said transverse section is triangular.

10. The semiconductor device according to claim 8, wherein the shape of said transverse section is like an arc.

11. A semiconductor device, comprising:
    a lead frame shaped like a sheet with electrical conductivity having first and second main surfaces, having pattern configuration, and having external terminals protruding outward provided therearound;
    a power semiconductor element fixed on said first main surface;
    a heat sink with thermal conductivity provided to face said second main surface with a gap therebetween; and
    a sealing resin being electrically insulating and sealing said power semiconductor element, said lead frame, and said heat sink;
    wherein said sealing resin has a primary sealing resin and a secondary sealing resin with heat conductivity more excellent than that of said primary sealing resin;
    said heat sink is disposed to selectively face a region including a portion corresponding to said power semiconductor element in said second main surface;
    said primary sealing resin has a body portion in close contact with said first main surface and burying said power semiconductor element and a block portion being like a projection selectively in close contact with said second main surface;

said secondary sealing resin has a portion selectively in close contact with said region including said portion corresponding to said power semiconductor element in said second main surface and filling a portion of said gap defined between said region and said heat sink;

said heat sink and said block portion are arranged almost in parallel in a region facing said second main surface; and said block portion occupies a main part of said sealing resin positioned on said second main surface side.

12. The semiconductor device according to claim 11, wherein an end of said block portion is exposed to the outside.

13. The semiconductor device according to claim 12, wherein said block portion extends across said sealing resin located on said second main surface side from its one end to the other end along said second main surface, and said secondary sealing resin further has a portion covering said body portion.

14. The semiconductor device according to claim 11, wherein a part of an end of said block portion abuts on said heat sink, said part is disposed off a region facing a region required to have a highest breakdown voltage with respect to said heat sink in said lead frame, and said secondary sealing resin further has a portion covering said block portion.

15. The semiconductor device according to claim 14, wherein said heat sink has a flat surface facing in parallel to said region including the portion corresponding to said power semiconductor element in said second main surface and a retracted surface retracted from said flat surface and abutting on said block portion.

16. The semiconductor device according to claim 15, wherein said primary sealing resin further has a spacer portion being like a projection selectively in close contact with said second main surface and having its end abutting on said heat sink, and said spacer portion is disposed off said region required to have a highest breakdown voltage with respect to said heat sink in said lead frame.

17. The semiconductor device according to claim 16, further comprising a controlling semiconductor element fixed on said first main surface for controlling said power semiconductor element, said body portion also burying said controlling semiconductor element.

18. The semiconductor device according to claim 17, wherein said secondary sealing resin is composed of an epoxy resin with filler increasing thermal conductivity mixed therein.

19. The semiconductor device according to claim 18, wherein said power semiconductor element is an IGBT element.

* * * * *